United States Patent [19]

Cropp et al.

[11] Patent Number: 4,808,435
[45] Date of Patent: Feb. 28, 1989

[54] SCREEN PRINTING METHOD FOR PRODUCING LINES OF UNIFORM WIDTH AND HEIGHT

[75] Inventors: Michael E. Cropp; Phillip De Prado, both of Poughkeepsie; Kamalesh S. Desai, Wappingers Falls, all of N.Y.

[73] Assignee: International Business Machines Corporation, Armonk, N.Y.

[21] Appl. No.: 34,972

[22] Filed: Apr. 6, 1987

[51] Int. Cl.$^4$ .......................... B05D 5/12; B05D 1/32; B05D 3/12

[52] U.S. Cl. ...................................... 427/97; 427/272; 427/277

[58] Field of Search ................ 427/264, 272, 282, 96, 427/277, 97; 118/406; 101/129

[56] References Cited

U.S. PATENT DOCUMENTS

| | | | |
|---|---|---|---|
| 3,384,931 | 5/1968 | Cochran et al. | 425/128 |
| 3,416,440 | 12/1968 | Miller et al. | 101/35 |
| 3,712,825 | 1/1973 | Yocum | 427/264 |
| 4,068,994 | 1/1978 | Cadwallader et al. | 425/110 |
| 4,245,273 | 1/1981 | Feinberg et al. | 361/382 |
| 4,327,124 | 4/1982 | DesMarais, Jr. | 427/96 |
| 4,604,298 | 8/1986 | Shevtchuk et al. | 427/282 X |

OTHER PUBLICATIONS

Gibney et al., IBM Technical Disclosure Bulletin, vol. 19, No. 5, Oct. 1976, pp. 1790-1791.
Davis, G. T. et al., "Automatic MLC Screening Mask Cleaner", IBM Technical Disclosure Bulletin, vol. 23, No. 8, Jan. 1981, pp. 3526-3529.

Primary Examiner—Evan Lawrence
Attorney, Agent, or Firm—Ira David Blecker

[57] ABSTRACT

An improved method for screen printing fine lines of conductive paste on a substrate wherein a mask having a desired pattern of line shaped openings is placed on the substrate, and conductive paste screened in the openings in the mask in contact with the substrate, and also as a thin layer over the top surface of the mask. The mask is removed from the substrate before the conductive paste in the openings dries, thereby leaving a fine pattern of paste lines with a uniform height on the substrate.

15 Claims, 2 Drawing Sheets

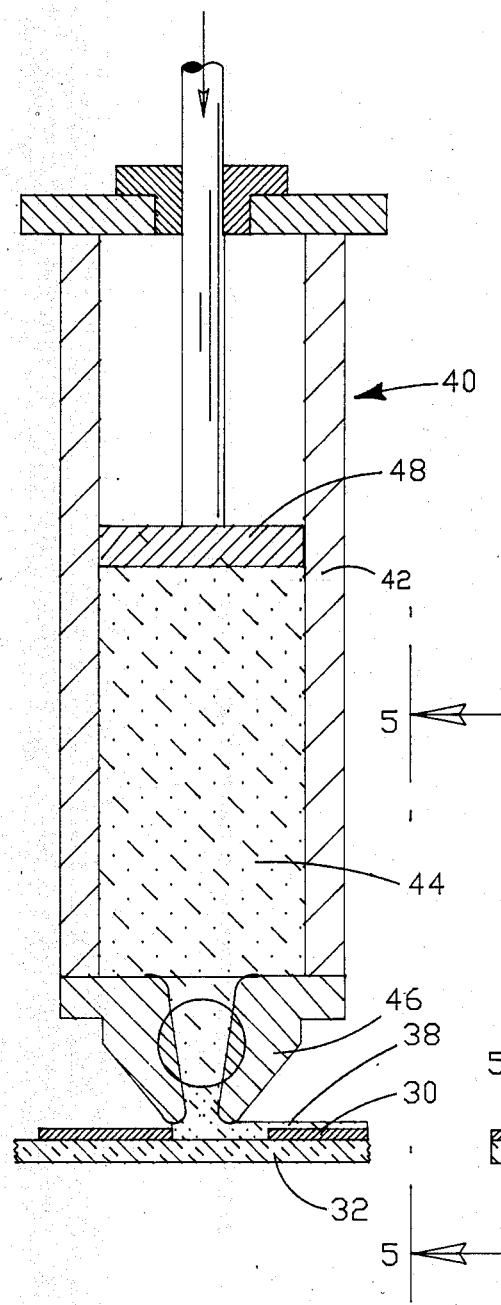
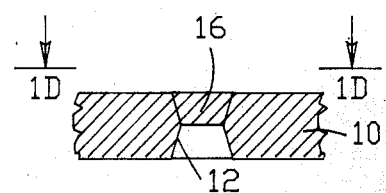
FIG. 1C
PRIOR ART
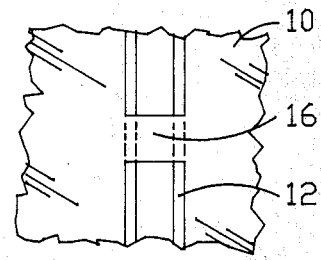
FIG. 1D
PRIOR ART
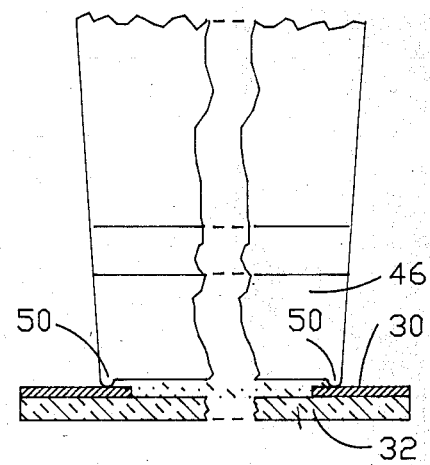
FIG. 4
FIG. 5

SCREEN PRINTING METHOD FOR PRODUCING LINES OF UNIFORM WIDTH AND HEIGHT

BACKGROUND OF THE INVENTION

The present invention relates generally to imprinting electrical patterns on substrates, and more particularly to an improved technique for screen printing fine lines of conductive paste on substrates, wherein the lines are better defined and have a more uniform height than screen printing by prior known techniques.

In the electronic packaging technology microminiaturized integrated circuit devices with thousands of circuits and often hundreds of I/O terminals are mounted on and electrically connected to circuitry of a larger support substrate. The support substrate frequently has mounted thereon a plurality of such integrated circuit devices which must be interconnected with each other an operative relationship. Also provided on the support substrate are large I/O terminals that are joined to the circuitry and which provide sufficiently large terminals to be joined to cooperating terminals on associated boards, cable connections or other connections that makes available the function of the devices to an overall machine, such as a computer.

As more circuitry was placed in the integrated circuit devices, the electrical circuitry in the support substrate became more complex and more miniaturized. These demands were met by using a multilayer ceramic substrate, as described in U.S. Pat. No. 4,245,273.

The MLC substrate is fabricated by preparing a slurry containing particulate ceramic material, an organic resin binder, and a solvent for the binder. The slurry is doctor bladed into sheets, the sheets dried, via holes punched into the sheets, circuitry patterns imprinted on the sheet, and the via holes filled with a conductive paste. The resultant sheets are assembled and laminated, and the resultant substrate sintered to burn off the binder and fuse the ceramic particles into a unitary element which contains an internal metallurgy system.

The via holes in the green ceramic and the circuitry pattern are conventionally deposited on the sheets by screen printing, wherein a mixture of a particulate metal, a vehicle, and a solvent, is deposited in openings in a mask placed over the sheet. Various apparatus for screen printing electrical patterns on substrates are described and claimed in U.S. Pat. Nos. 3,384,931, 3,416,440 and 4,068,994. As the circuitry patterns in the masks became more complex, metal tabs with a thickness less than the thickness of the mask were provided periodically in the openings defining the line patterns to preserve the integrity of the mask. Such tab elements in masks are described in IBM TDB October 1967 P. 1790.

As the deposited circuitry lines become smaller and more closely spaced, the tolerance of height and width of the screened lines become more critical. An open in the line or a short between closely spaced lines may render the substrate useless. Further, such defects may not be detected until it is tested after it has been sintered. At this point in time, a great deal of money has been invested in the substrate. The scrapping of the substrate at this stage is expensive.

SUMMARY OF THE INVENTION

An object of this invention is to provide an improved process for depositing fine, uniform, well-defined, metallurgy lines on substrates.

Another object of this invention is to provide an improved process for screen printing metallurgy patterns on substrates wherein the lines have a uniform width and height.

Yet another object of this invention is to provide a screening process that minimizes mask wear.

These and other objects of the invention are accomplished by a novel screening method for depositing fine lines of electrically conductive paste on a substrate. The method includes the steps of placing a mask with the desired pattern of line shaped openings on the substrate, screening paste in the openings in the mask, and also a thin layer over the top surface of the mask, and removing the mask from the substrate before the paste in the openings dries thereby leaving a line pattern of paste with a uniform height on the substrate.

BRIEF DESCRIPTION OF THE DRAWINGS

FIG. 1C is an elevational view in broken section of a screening mask illustrating a tab element which traverses a screening mask line opening.

FIG. 1D is a top profile view of the structure shown in 1C.

FIG. 4 is a cross-sectional view of an extrusion printer positioned over a mask substrate performing a vital step in the process of our invention.

FIG. 5 is a side view taken on line 5—5 of FIG. 4.

DESCRIPTION OF PREFERRED EMBODIMENTS

Figure 1A:
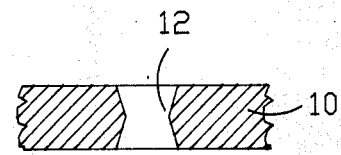
FIG. 1A is an elevational view in broken section of a screening mask illustrating a typical mask opening profile.
Figure 1B:
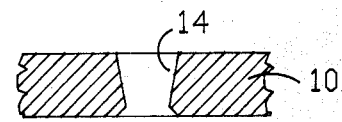
FIG. 1B is an elevational view in broken section of another embodiment of a screening mask illustrating a mask opening profile.

Referring now to the drawings in the specification, more particularly to FIGS. 1A, 1B and 1C, there are illustrated profile views of openings in conventional masks used in the process of screen printing. Such masks are normally made by depositing a resist layer on opposite sides of the metal sheet 10, exposing similar patterns in the resist layers that are in alignment, and etching from both sides of the sheet 10. In FIG. 1A the amount of etching from each side is approximately the same, and opening 12 is symmetrical. The tapered sidewalls results because the metal etchant etches downwardly and laterally. The opening 14 in mask 10 that is illustrated in FIG. 1B is non-symmetrical, and formed by etching more of the depth of the opening from one side than from the other. In FIGS. 1C and 1D there is illustrated an opening 12, defining a line, that is provided with a tab 16 that bridges the line opening at periodic intervals. The tabs preserve the integrity of the mask and it is particularly important when the mask contains many long, closely-spaced line openings.

Figure 2A:
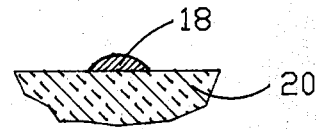
FIG. 2A is a profile view of a screened line having a low height which typifies the screening line produced by the method of this invention.
Figure 2B:
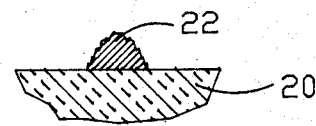
FIG. 2B is a profile view of a screened paste line having a greater height, and a profile undesirable for high density packaging applications.

Referring now to FIGS. 2A and 2B, profile view of line patterns produced by screened printing are illustrated. Line 18 on substrate 20 illustrates a screened paste stripe with a well-defined, symmetrical, smooth profile, with a relatively low height. The line is typical of the desired type of line produced by the process of our invention. Such lines when laminated will not spread out and short across to adjacent lines. In contrast, line 22 illustrated in 2B has a poorly defined, relatively high height which is undesirable. Such lines are much more likely to spread out and short across to an adjacent line when a sheet containing the lines are laminated.

Figure 3A:
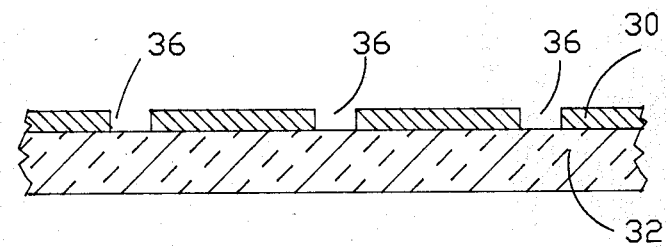
FIGS. 3A, 3B and 3C are profile views in broken section which illustrate the steps of the novel method of our invention.
Figure 3B:
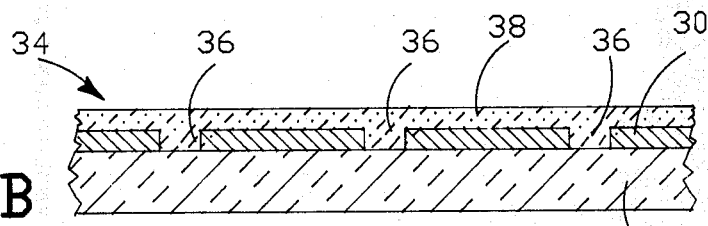

Referring now to FIGS. 3A to 3B, there is illustrated the basic steps in the screening method of our invention. A screening mask 30 is placed over substrate 32 with the opening pattern oriented to via holes (not shown) in the substrate 32. As shown in FIG. 3B, a layer 34 of conductive paste is deposited (1) in openings 36, (2) in via holes (not shown) in the substrate 32, and (3) as a thin layer 38 on the top surface of the mask 30. The paste deposition can be done with any suitable apparatus. It is preferably achieved with an extrusion type printer 40 of the type shown in FIG. 4. Printer 40 has a cylinder 42 filled with paste 44 that is forced out of nozzle 46 by piston 48. The nozzle 46 is provided with spaced shoulders 50, as shown in FIG. 5, which hold the end of the nozzle in spaced relation to the mask 30. This spaced relation results in the spreading of paste on the surface of the mask to form the layer 38.

Figure 3C:
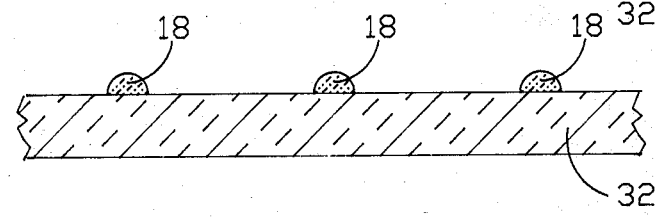

It has been discovered that the porous nature of a ceramic or glass-ceramic substrate very quickly absorbs the solvent in the paste that is deposited in the openings in the mask. This causes the paste to become "dried out". When the mask is lifted from the substrate, the paste must remain fluid in order to flow through the slightly constricted openings, shown in FIGS. 1A and 1B, and to subsequently form a relatively low and uniform stripe profile as shown in FIGS. 2A and 3C. When the paste is dried by the removal of some of the solvent, the resultant stripe 22 will have a higher profile, with a rough surface, as illustrated in FIG. 2B. Further, if the drying of the paste is severe, segments thereof may remain with the mask thereby forming an "open" in the printed line. The more drying of the paste, the more non-uniform will be the line height since the paste flow is restricted, particularly in the area of the tabs.

The above-described problems are prevalent in screen printing of paste by prior art techniques on substrates capable of absorbing the solvent. The problems become more severe as the geometry of the lines become more miniaturized.

In the method of this invention, there is provided a layer of paste on the top surface of the mask, which is a source of additional paste solvent in the printed lines in the openings of the mask to replace the solvents absorbed by the substrate as the solvent is removed from the paste. The retention of the solvent assures that the paste within the openings in the mask will remain fluid and result in uniform, relatively low printed lines with a smooth exterior surface. The paste layer on the mask must be removed prior to re-use of the mask.

The practice of our invention is useful when depositing paste on any substrate that has a tendency to absorb a solvent in the paste. It is particularly useful in screen printing lines on green ceramic sheets or green glass ceramic sheets that will be laminated to form a multilayer substrate with an internal metallurgy system. Such sheets can have any suitable thickness, but usually have a thickness in the range of 7 to 12 mils. Any suitable paste can be used in the process. Normally the paste will include conductive metal particles such as Mo, Ta, Cu, Ag, etc. or combinations thereof. The paste can have any suitable solvent or combination of solvents. A typical solvent is butyl carbitol acetate. Normally the paste will include an organic binder, such as ethylcellulose, and a vehicle. The metal mask can have any suitable thickness. A typical mask has a thickness in the range of 2-5 mils, most preferably of the order of 4 mils. The processing of the invention is most applicable to the screen printing of relatively fine lines which are formed by line openings in the mask having a width in the range of 2-6 mils.

The thickness of the paste layer on the top surface of the mask can be any suitable thickness. Preferably the paste layer will have a thickness in the range of $\frac{1}{2}$-3 mils. An alternate method of stating the paste thickness is that the ratio of the layer of paste to the mask thickness is in the range of $\frac{1}{4}$ to 1. The mask thickness is conventionally in the range of 2-5 mils, more preferably of the order of 4 mils.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An improved method of screen printing fine lines of electrically conductive paste on a substrate, comprising,
    obtaining a substrate capable of absorbing solvent from a conductive paste to be applied,
    placing a mask having the desired pattern of line shaped openings on the substrate,
    applying conductive paste to the mask such that conductive paste is screened in the openings in the mask in contact with the substrate and such that a thin layer of conductive paste is formed over the top surface of the mask, the thin layer capable of maintaining the paste in the openings fluid by supplying solvent, thereby allowing the paste to flow through the openings when the mask is lifted, and
    removing the mask from the substrate before the conductive paste dries thereby leaving a line pattern of paste with a well-defined, symmetrical, smooth profile, with a relatively low height on said substrate.

2. The method of claim 1 wherein said substrate is a green ceramic or green glass ceramic sheet.

3. The method of claim 2 wherein said sheet has via holes which are filled with the conductive paste during said screening.

4. The method of claim 3 wherein said sheet has a thickness in the range of 7 to 12 mils.

5. The method of claim 4 wherein said conductive paste includes Mo particles.

6. The method of claim 5 wherein said conductive paste further includes ethylcellulose as an organic binder, and butyl carbitol acetate as a solvent.

7. The method of claim 1 wherein said mask is formed of metal having a thickness in the range of 2-5 mils.

8. The method of claim 7 wherein said metal mask further includes tab elements that periodically bridge said line shaped openings.

9. The method of claim 7 wherein the metal mask has a thickness on the order of 4 mils.

10. The method of claim 7 wherein said line shaped openings have a width in the range of 2-6 mils.

11. The method of claim 7 wherein the ratio of the thickness of said thin layer of paste on the mask to the thickness of the mask is in the range of ¼ to 1.

12. The method of claim 9 wherein the ratio of the thickness of said thin layer of paste on the mask to the thickness of the mask is in the range of ¼ to 1.

13. The method of claim 1 wherein said paste is applied to said mask with a nozzle having a recessed surface that is maintained in spaced relation to the top surface of said mask.

14. The method of claim 1 wherein said substrate is a green glass ceramic sheet and said paste includes particulate Cu.

15. The method of claim 1 wherein said thin layer of paste on said mask has a thickness in the range of ½ to 3 mils.

* * * * *